United States Patent
Shimada et al.

(10) Patent No.: US 9,899,981 B2
(45) Date of Patent: Feb. 20, 2018

(54) MULTI-BAND LIMITER, SOUND RECORDING APPARATUS, AND PROGRAM STORAGE MEDIUM

(71) Applicant: TEAC CORPORATION, Tokyo (JP)

(72) Inventors: Hirotoshi Shimada, Tokyo (JP); Shigeyuki Adachi, Tokyo (JP)

(73) Assignee: TEAC Corporation, Tokyo (JP)

( * ) Notice: Subject to any disclaimer, the term of this patent is extended or adjusted under 35 U.S.C. 154(b) by 0 days.

(21) Appl. No.: 15/335,127

(22) Filed: Oct. 26, 2016

(65) Prior Publication Data
US 2017/0117865 A1    Apr. 27, 2017

(30) Foreign Application Priority Data
Oct. 27, 2015    (JP) .................................. 2015-211309

(51) Int. Cl.
*H03G 5/00*    (2006.01)
*H03G 11/00*    (2006.01)
(Continued)

(52) U.S. Cl.
CPC .......... *H03G 11/008* (2013.01); *H03G 9/005* (2013.01); *H03G 9/025* (2013.01); *H04R 3/14* (2013.01);
(Continued)

(58) Field of Classification Search
CPC . G10L 21/038; G10L 19/0204; G10L 19/167; G10L 19/265; G10L 19/26;
(Continued)

(56) References Cited

U.S. PATENT DOCUMENTS

| 9,307,323 B2 * | 4/2016 | Risberg .................... H04R 3/04 |
| 2004/0057587 A1 * | 3/2004 | Thiel ......................... H04R 3/14 |
| | | 381/98 |

(Continued)

FOREIGN PATENT DOCUMENTS

WO    2011/048741 A1    4/2011

*Primary Examiner* — Norman Yu
(74) *Attorney, Agent, or Firm* — Seed Intellectual Property Law Group LLP

(57) ABSTRACT

A multi-band limiter, a sound recording apparatus, and a program are provided having a multi-band limit function with a flat frequency characteristic while removing a dead zone of a multi-band limiter. A cross-over filter unit divides an input sound signal into a low-band component, a middle-band component, and a high-band component so that the adjacent bands cross at −6 dB. An overlap filter unit includes a low-band filter element, a middle-band filter element, and a high-band filter element that respectively divide the input sound signal into a low-band component, a middle-band component, and a high-band component, and applies a limit process to divide the input sound signal in such a manner that the low-band component and the middle-band component overlap each other and the middle-band component and the high-band component overlap each other by setting a high-band side cutoff frequency of the low-band filter element to be greater than or equal to a low-band side cutoff frequency of the middle-band filter element and setting a high-band side cutoff frequency of the middle-band filter element to be greater than or equal to a low-band side cutoff frequency of the high-band filter element, and set a control gain by a CG for each band, and an adder combines the components.

6 Claims, 5 Drawing Sheets

(51) Int. Cl.
*H03G 9/00* (2006.01)
*H03G 9/02* (2006.01)
*H04R 3/14* (2006.01)

(52) U.S. Cl.
CPC ...... *H04R 2430/01* (2013.01); *H04R 2430/03* (2013.01)

(58) Field of Classification Search
CPC ... G10L 25/18; G10L 19/008; G10L 21/0232; H04R 3/00; H04R 3/14; H04R 3/04; H04R 5/04; H04S 3/00; H04S 7/307; H03G 3/20; H03G 9/025; H03G 5/005; H03G 5/165; H03G 11/008; G10K 2210/3028; G10K 2210/3056; G11C 7/00
USPC ......... 381/98, 99, 103, 107, 307, 58, 1, 102, 381/104, 106, 124, 316, 61, 80; 700/94; 704/205, 225; 455/112, 118, 232.1
See application file for complete search history.

(56) References Cited

U.S. PATENT DOCUMENTS

2012/0209616 A1* 8/2012 Hosokawa ............. H03G 9/025
 704/500
2014/0379355 A1 12/2014 Hosokawsa

* cited by examiner

Prior Art

MULTI-BAND LIMITER, SOUND RECORDING APPARATUS, AND PROGRAM STORAGE MEDIUM

CROSS REFERENCE TO RELATED APPLICATION

The entire disclosure of Japanese Patent Application No. 2015-211309 filed on Oct. 27, 2015 including the specification, claims, drawings, and abstract is incorporated herein by reference in its entirety.

TECHNICAL FIELD

The present disclosure relates to a multi-band limiter, a sound recording apparatus, and a program storage medium.

BACKGROUND

In order to record an input sound properly, a limiter for the input sound is an important function. A normal limiter operates with respect to all frequency bands of the sound to be recorded. Thus, for example, even when a peak is detected at a frequency band different from the frequency band of the sound desired to be recorded, gain reduction is executed for all frequency bands. Because of this, sound in the frequency band of the sound it is desired to record is also reduced.

As a countermeasure in such a case, a multi-band limiter is being proposed. In a multi-band limiter, the whole frequency band is divided into a plurality of bands, and a limit process is executed independently for each frequency band, so that the gain reduction due to an instantaneous peak in a certain frequency band does not affect other frequency bands.

WO 2011/048741 discloses a multi-band compressor, and describes that, in a typical multi-band compressor of the related art, compressors of the frequency bands operate independently from each other, and that in order to solve the problem associated with the independent operation, a gain value is calculated from a signal level calculated in each frequency band, and the gain value used for a compression process is limited by comparing the gain values calculated at various frequency bands.

One problem associated with the multi-band limiter is a slope of a filter when the frequency band is divided. Filters for cutting out adjacent frequency bands are normally set to cross at −6 dB (hereinafter referred to as "cross-over filter"), so that the frequency characteristic becomes flat after the divided frequency bands are combined.

However, in the filter process with such a cross-over filter, a band in which the filter is not applied, which is also called a dead zone, occurs in frequency bands above and below the crossed frequency. Specifically, in this zone, originally, even for a signal having a level exceeding a threshold and for which the gain should be reduced, because the level of the input sound is attenuated by the filter, the signal level after the attenuation becomes less than or equal to the threshold and the gain cannot be reduced. In addition, when the slope of the filter is not steep, signals of the same frequency would exist in both adjacent frequency bands, and in this case, the limiter is applied to one signal but not to the other. Consequently, when the signals are added in the combining process, a frequency band in which the limiter is not applied is generated, and the dead zone may be further widened.

FIGS. 4A and 4B show a frequency characteristic of a multi-band limiter of the related art. The frequency bands are divided into three bands, LOW, MIDDLE, and HIGH, the signals are divided with the filters of these bands crossing at −6 dB (FIG. 4A), the limit process is executed for each band (FIG. 4B), and the signals of the bands are added and combined. In other words, the flow is:

frequency band division (−6 dB cross)→limit process for each band→combining.

However, because the signal is attenuated in the frequency band near adjacent frequency bands as shown in FIG. 4A, a signal which should be limited by the threshold, that is, the limiter level, is not limited, and the limiter is not applied. FIG. 4B shows the dead zone of the limiter thus created. When the dead zone of the filter appears, if there is a peak level of the sound volume in this portion, the peak level cannot be limited, and sound recording failure may result due to overpeak (excessive peak of the sound volume).

SUMMARY

An advantage of the present disclosure lies in provision of a multi-band limiter, a sound recording apparatus, and a program having a multi-limit function with a flat frequency characteristic, while removing the dead zone of the multi-band limiter.

According to one aspect of the present disclosure, there is provided a multi-band limiter comprising: a divider that includes a first filter element that divides an input sound signal into at least a first component which is of a relatively low band and a second filter element that divides the input sound signal into a second component which is of a relatively high band, and that divides the input sound signal in such a manner that a high-band side cutoff frequency of the first filter element is lower than a low-band side cutoff frequency of the second filter element and amounts of attenuation of the first component and the second component cross each other at a predetermined amount of attenuation; a limiter that includes a third filter element that divides the input sound signal into at least a third component which is of a relatively low band and a fourth filter element that divides the input sound signal into a fourth component which is of a relatively high band, and that applies a limit process to divide the input sound signal in such a manner that the third component and the fourth component overlap each other by setting a high-band side cutoff frequency of the third filter element to be greater than or equal to a low-band side cutoff frequency of the fourth filter element, to set a first control gain according to the third component and set a second control gain according to the fourth component, and to limit a level of the first component using the first control gain and limit a level of the second component using the second control gain; and a combiner that combines and outputs the limit-processed first component and the limit-processed second component.

According to another aspect of the present disclosure, the divider divides the input sound signal into a low-band component, a middle-band component, and a high-band component, the limiter includes a low-band filter element, a middle-band filter element, and a high-band filter element that respectively divide the input sound signal into a low-band component, a middle-band component, and a high-band component, and applies the limit process to divide the input sound signal in such a manner that the low-band component and the middle-band component overlap each other and the middle-band component and the high-band component overlap each other by setting a high-band side cutoff frequency of the low-band filter element to be greater than or equal to a low-band side cutoff frequency of the middle-band filter element and setting a high-band side cutoff frequency of the middle-band filter element to be greater than or equal to a low-band side cutoff frequency of the high-band filter element, and to set a control gain for each of the low-band component, the middle-band component, and the high-band component, and the combiner combines and outputs the limit-processed low-band component, the limit-processed middle-band component, and the limit-processed high-band component.

According to another aspect of the present disclosure, the divider sets the predetermined amount of attenuation at −6 dB.

According to another aspect of the present disclosure, there is provided a sound recording apparatus comprising: the above-described multi-band limiter; and a recorder that records an output signal from the multi-band limiter.

According to another aspect of the present disclosure, there is provided a computer-readable program storage medium that stores a program which, when executed, causes a processor of a computer to function as: a divider that includes a first filter element that divides an input sound signal into at least a first component which is of a relatively low band and a second filter element that divides the input sound signal into a second component which is of a relatively high band, and that divides the input sound signal in such a manner that a high-band side cutoff frequency of the first filter element is lower than a low-band side cutoff frequency of the second filter element and amounts of attenuation of the first component and the second component cross each other at a predetermined amount of attenuation; a limiter that includes a third filter element that divides the input sound signal into at least a third component which is of a relatively low band and a fourth filter element that divides the input sound signal into a fourth component which is of a relatively high band, and that applies a limit process to divide the input sound signal in such a manner that the third component and the fourth component overlap each other by setting a high-band side cutoff frequency of the third filter element to be greater than or equal to a low-band side cutoff frequency of the fourth filter element, to set a first control gain according to the third component and set a second control gain according to the fourth component, and to limit a level of the first component using the first control gain and limit a level of the second component using the second control gain; and a combiner that combines and outputs the limit-processed first component and the limit-processed second component.

According to various aspects of the present disclosure, a multi-band limiter, a sound recording apparatus, and a program can be obtained having a multi-band limit function with a flat frequency characteristic while removing a dead zone. According to various aspects of the present disclosure, in field recording or the like, for example, sound to be recorded can be clearly recorded while preventing failure of sound recording due to peak-over of the sound volume level.

BRIEF DESCRIPTION OF DRAWINGS

Embodiment(s) of the present disclosure will be described based on the following figures, wherein.

DESCRIPTION OF EMBODIMENTS

Figure 1:
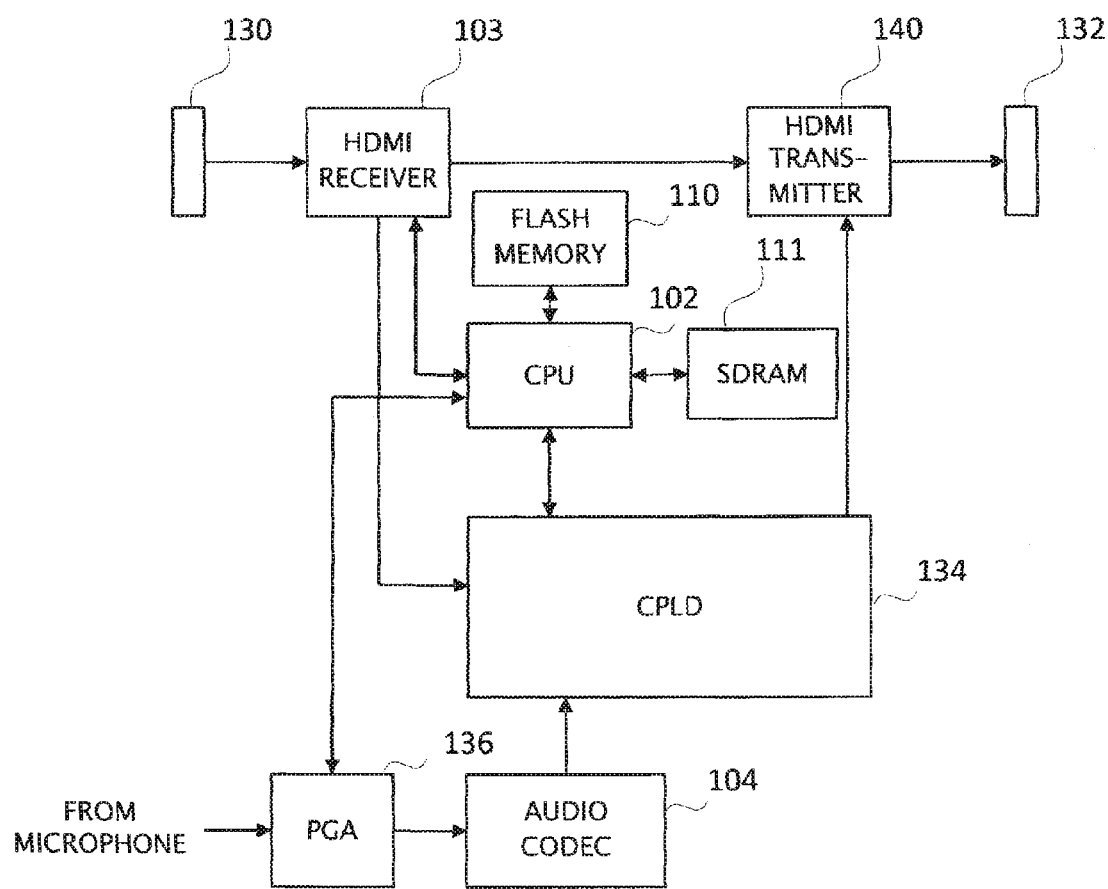
FIG. 1 is an overall structural block diagram of an embodiment of the present disclosure.

An embodiment of the present disclosure will now be described with reference to the drawings. The embodiment is merely exemplary, and the present disclosure is not limited to the following embodiment.

<Basic Principle>

First, a basic principle of an embodiment of the present disclosure will be described.

As already described, in general, in a multi-band limiter, the filters which cut out adjacent frequency bands are set to cross at −6 dB. Specifically, in each frequency band, the signal is attenuated by 6 dB to reach the cross point, so that after the signals of the frequency bands that are divided are combined, the frequency characteristic is approximately flat (it is known that, with an amount of attenuation of −6 dB in each of the high-pass and low-pass cross points, a superior overall characteristic can be achieved and the outputs of the high-pass side and the low-pass side at the cross frequency can be set in the same phase). On the other hand, a dead zone in which the filter is not applied may occur when crossing at −6 dB. This is true for a 2-way cross-over in which the input sound signal is divided into two bands and also for a 3-way cross-over in which the input sound signal is divided into three bands.

In consideration of this, in the present embodiment, as filters for dividing the input sound signal into a plurality of frequency bands, a cross-over filter that crosses at −6 dB is used similar to the related art, and in addition, a filter that sets limit levels for frequency bands to overlap each other at adjacent frequency bands (hereinafter, also referred to as "overlap filter") is used to divide (extract) the signal, and sets the attenuation based on these signals. With the use of the overlap filter, the dead zone can be removed and the limit level can be appropriately set. The overlap filter includes a first filter element that divides the input sound signal into at least a first component which is of a relatively low band and a second filter element that divides the input sound signal into a second component which is of a relatively high band, and divides the input sound signal in such a manner that the first component and the second component overlap each other by setting a high-band side cutoff frequency of the first filter element to be greater than or equal to a low-band side cutoff frequency of the second filter element. A number of frequency bands into which the input sound signal is divided may be greater than or equal to two. For example, when the input sound signal is to be divided into three components, the filter includes a low-band filter element, a middle-band filter element, and a high-band filter element that respectively divide the input sound signal into a low-band component, a middle-band component, and a high-band component, and the filter divides the input sound signal in such a manner that the low-band component and the middle-band component overlap each other and the middle-band component and the high-band component overlap each other by setting a high-band side cutoff frequency of the low-band filter element to be greater than or equal to a low-band side cutoff frequency of the middle-band filter element, and setting a high-band side cutoff frequency of the middle-band filter element to be greater than or equal to a low-band side cutoff frequency of the high-band filter element.

A limit level is set for each frequency band with the overlap filter, the input sound signal is divided by the cross-over filter of the related art into at least a first component which is of relatively low band and a second component which is of a relatively high band, and a limit process is executed using the limit level which is set for each frequency band. After the limit process is executed for each frequency band, the signals of the frequency bands are combined.

As described, by combining the cross-over filter and the overlap filter, it becomes possible to realize a multi-band limit function having a flat frequency characteristic while removing the dead zone.

When the multi-band limiter is used in editing or the like after sound recording, because the characteristic of the input sound is known in advance, it may be possible to avoid the influence of the dead zone by employing a design so that the crossing frequency can be changed by the user. However, at the recording site such as with, for example, field sound recording, because the characteristic of the input sound is not known in advance, it is not possible to set the crossing frequency in advance. The present embodiment is not particularly limited to this configuration, but is especially effective when the characteristic of the input sound is not known in advance such as in the case of field sound recording or the like.

<Structure>

Next, a specific structure of a sound recording apparatus according to the present embodiment will be described exemplifying a sound recording apparatus having an HDMI terminal. It should be noted that the HDMI terminal is not an indispensable structural element in the present disclosure.

The sound recording apparatus is a PCM recorder, and records a sound signal in a linear PCM:WAV format which does not irreversibly compress the sound signal. Alternatively, the apparatus may correspond to an irreversible compression format such as MP3. The sound recording apparatus receives a video signal included in an HDMI signal from a camera which is HDMI-connected, for example, and with regard to the video signal, serves as an HDMI repeater device to output the video signal to a backup video recording device or the like which is HDMI-connected, without any processing. On the other hand, the sound recording apparatus converts an analog audio signal which is input from a microphone which is connected to the apparatus into a digital signal, embeds the signal in an audio CH of an HDMI signal from the camera, and outputs the signal to the backup video recording device or the like which is HDMI-connected.

The backup video recording device receives, from the sound recording apparatus which is HDMI-connected, the video signal captured by the camera and the audio signal recorded by the sound recording apparatus, both through the HDMI. Even if the backup video recording device only has an analog sound input terminal as the sound input terminal, a high-quality audio signal can be input from the HDMI input terminal.

FIG. 1 is an overall structural block diagram of the sound recording apparatus. The sound recording apparatus comprises an HDMI input terminal (HDMI IN) 130, an HDMI output terminal (HDMI OUT) 132, an HDMI receiver 103, an HDMI transmitter 140, a CPU 102, a CPLD (Complex Programmable Logic Device) 134, an audio CODEC 104, and a PGA (Programmable Gain Amplifier) 136.

The HDMI input terminal 130 is connected to the camera via an HDMI cable.

The HDMI receiver 103 outputs an LRCK signal, a BCLK (or SCLK) signal, a data signal, and an MCLK signal based on a TMDS signal and a TMDS clock signal transmitted from the camera via the HDMI cable. The CPU 102 is connected to the HDMI receiver 103 through an I2C bus, and the CPU 102 controls operation of the HDMI receiver 103. The HDMI receiver 103 serves as an HDMI repeater device, and outputs the video signal included in the data signal to the HDMI transmitter 140 without any further processing. On the other hand, the HDMI receiver 103 supplies the audio signal included in the data signal to the CPLD 134. The CPLD 134 receives the audio signal which is output from the HDMI receiver 103, and inputs the signal to a multiplexer (MUX) 136, and also outputs the signal to the CPU 102.

On the other hand, the analog audio signal which is input from the microphone is gain-adjusted by the PGA 136, converted into a digital signal by the audio CODEC 104, and supplied to the CPLD 134. The gain of the PGA 136 is controlled by the CPU 102. The CPLD 134 supplies the analog audio signal which is input from the microphone to the CPU 102, applies a multi-band limit process using the CPU 102, and records the sound, and in addition, applies an embedding process to the audio signal from the HDMI receiver 103 as necessary. The embedded (multiplexed) signal is output to the HDMI transmitter 140. The HDMI transmitter 140 supplies the video signal from the HDMI receiver 103, and the audio signal in which the microphone audio signal is embedded in the CPLD 134, to the HDMI output terminal 132.

In the following, a process will be described in which the audio signal which is input from the microphone and converted into a digital signal is processed by the CPU 102 (including the multi-band limit process), and is recorded as audio data on a semiconductor memory such as an SD card memory.

The CPU 102 reads out a process program and executes the multi-band limit process using a flash memory 110 and an SDRAM 111 respectively as a program memory and a working memory. The CPU 102 records the sound by recording the processed audio data in the flash memory 110 or in an SD card memory equipped on an SD card connector (not shown).

Figure 2:
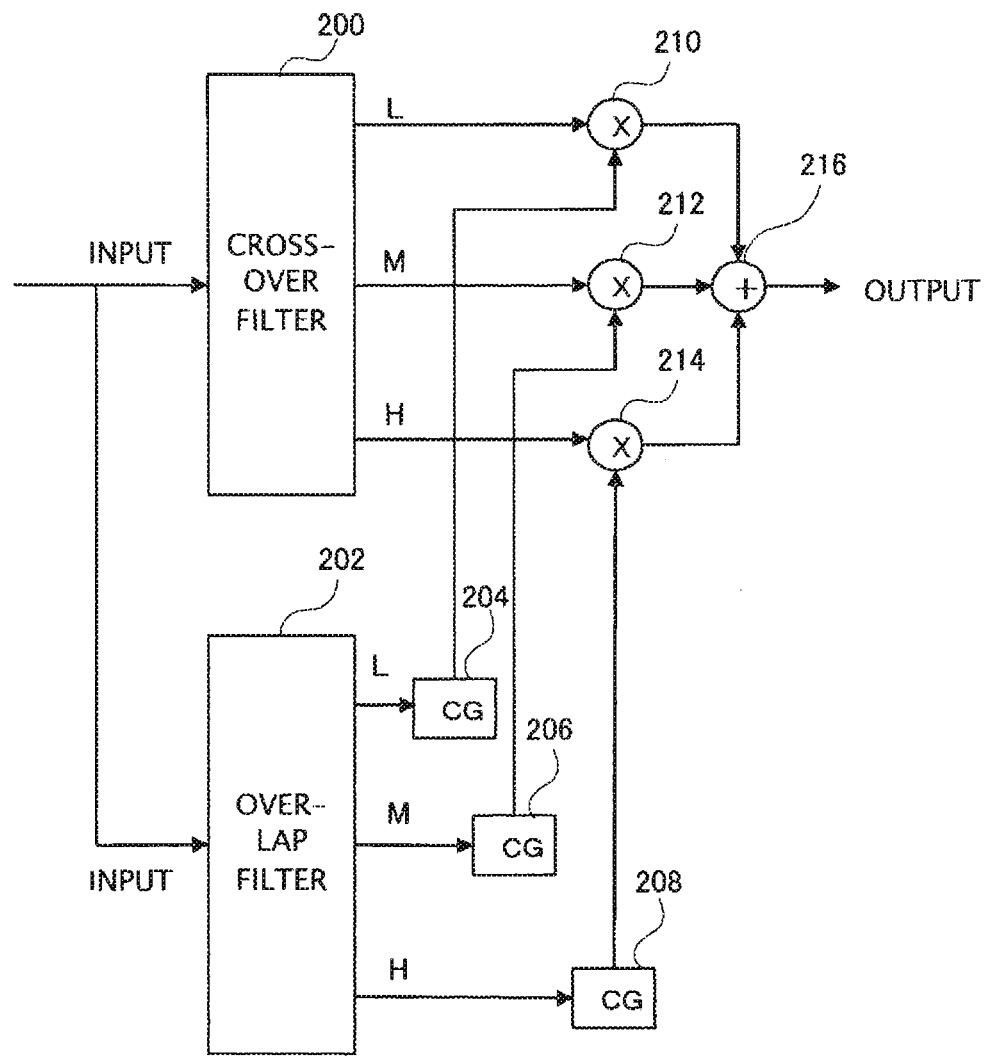
FIG. 2 is a functional block diagram of a multi-band limiter according to an embodiment of the present disclosure.

FIG. 2 is a functional block diagram of a multi-band limit process realized by the CPU 102 executing the process program. Thus, the functions of FIG. 2 are not realized by specific hardware circuits, but by the CPU 102 executing respective functional modules of the process program.

The multi-band limit function includes a cross-over filter unit 200, an overlap filter unit 202, control gains (CG) 204, 206, and 208, multipliers 210, 212, and 214, and an adder 216. The cross-over filter unit 200 functions as a divider which divides an input sound signal into a low-band component, a middle-band component, and a high-band component, the overlap filter unit 202, the CGs 204, 206, and 208, and the multipliers 210, 212, and 214 function as a limiter, and the adder 216 functions as a combiner which combines three signal components.

Similar to the related art, the cross-over filter unit 200 divides the input sound signal into the low band (L), the middle band (M), and the high band (H) with a filter characteristic such that adjacent frequency bands cross at −6 dB. The low-band component is output to the multiplier 210, the middle-band component is output to the multiplier 212, and the high-band component is output to the multiplier 214.

The overlap filter unit 202 similarly divides the input sound signal into the low band, the middle band, and the high band, but has a filter characteristic in which the components overlap each other between adjacent frequency bands, in place of the filter characteristic of the cross-over filter unit 200 which crosses at −6 dB.

The low-band component is output to the CG 204, the middle-band component is output to the CG 206, and the high-band component is output to the CG 208.

The CG 204 sets a control gain based on the low-band component, and outputs the gain to the multiplier 210. Specifically, the CG 204 compares the signal level of the low-band component with a threshold, and sets a lower gain coefficient in order to limit the signal level when the signal level exceeds the threshold, and outputs the set gain coefficient to the multiplier 210.

Because the low-band component is a signal from the overlap filter unit 202, unlike the related art, the signal level compared to the threshold is not the signal level after the attenuation, and the gain coefficient can be reliably set low when the signal level exceeds the threshold.

The multiplier 210 multiplies the low-band component by the control gain coefficient from the CG 204, to limit the level of the low-band component, and operates as a low-band limiter.

The CG 206 sets a control gain based on the middle-band component, and outputs the set control gain to the multiplier 212. Specifically, the CG 206 compares the signal level of the middle-band component with a threshold, sets a lower gain coefficient to limit the signal level when the signal level exceeds the threshold, and outputs the set gain coefficient to the multiplier 212.

Because the middle-band component also is a signal from the overlap filter unit 202, unlike the related art, the signal level compared to the threshold is not the signal level after the attenuation, and the gain coefficient can be reliably set low when the signal level exceeds the threshold. The multiplier 212 multiplies the middle-band component by the control gain coefficient from the CG 206, to limit the level thereof and operates as a middle-band limiter.

The CG 208 sets a control gain based on the high-band component, and outputs the set control gain to the multiplier 214. Specifically, the CG 208 compares the signal level of the high-band component with a threshold, sets a lower gain coefficient to limit the signal level when the signal level exceeds the threshold, and outputs the set gain coefficient to the multiplier 214.

Because the high-band component also is a signal from the overlap filter unit 202, unlike the related art, the signal level compared to the threshold is not the signal level after the attenuation, and the gain coefficient can be reliably set low when the signal level exceeds the threshold. The multiplier 214 multiplies the high-band component by a control gain coefficient from the CG 208, to limit the level thereof, and operates as a high-band limiter.

The limit-processed low-band component from the multiplier 204, the limit-processed middle-band component from the multiplier 210, and the limit-processed high-band component from the multiplier 214 are combined by the adder 216, and are output.

Figure 3A:
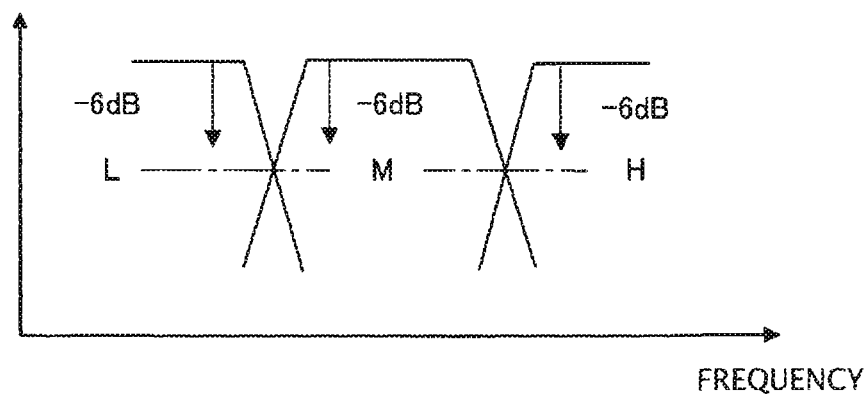
FIG. 3A is an explanatory diagram of a filter characteristic of a cross-over filter unit according to an embodiment of the present disclosure.
Figure 3B:
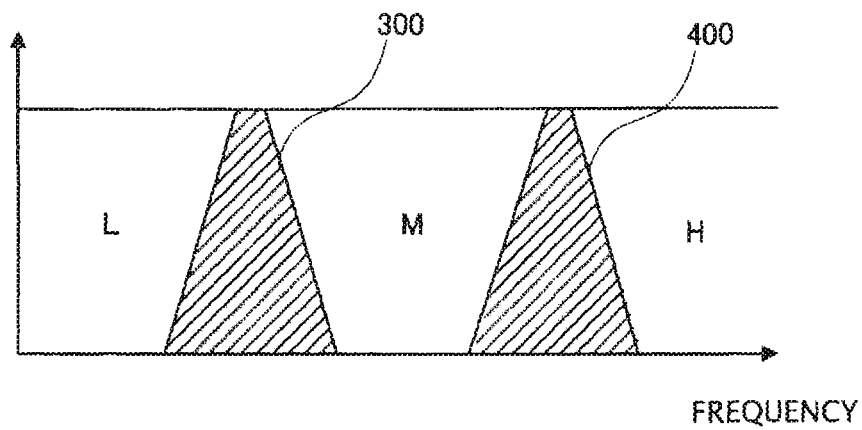
FIG. 3B is an explanatory diagram of a filter characteristic of an overlap filter unit according to an embodiment of the present disclosure.
Figure 4A:
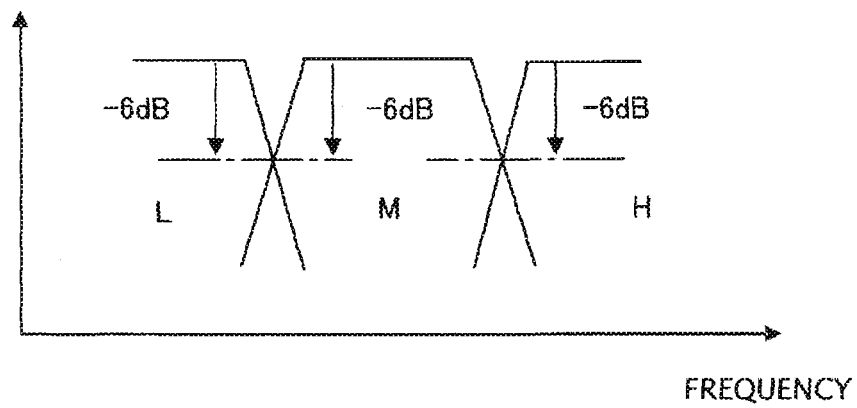
FIG. 4A is an explanatory diagram of a filter characteristic of a multi-band limiter according to the related art.
Figure 4B:
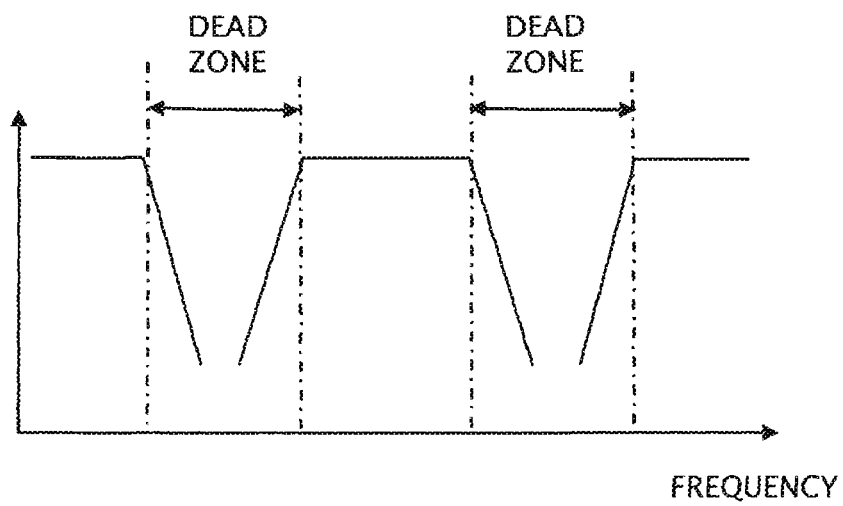
FIG. 4B is an explanatory diagram of a limiter characteristic of a multi-band limiter according to the related art.

FIGS. 3A and 3B are characteristic diagrams of the multi-band limit process of the present embodiment. FIG. 3A shows a filter characteristic of the cross-over filter unit 200. Similar to FIG. 4A, the characteristic is such that the adjacent frequency bands cross at −6 dB.

On the other hand, FIG. 3B shows a filter characteristic of the overlap filter unit 202. In a low-band filter, a middle-band filter, and a high-band filter for respectively dividing the frequency bands to the low band, the middle band, and the high band, the low-band filter and the middle-band filter overlap each other at an overlap portion 300 shown with hatching, and the middle-band filter and the high-band filter overlap each other at an overlap portion 400 shown with hatching. Thus, a signal component of the frequency band of the overlap portion 300 is extracted by the low-band filter and also by the middle-band filter, and a signal component of the frequency band of the overlap portion 400 is extracted by the middle-band filter and also by the high-band filter. When a cutoff frequency of the low-band filter is fLc, a low-band side cutoff frequency of the middle-band filter is fMLc, a high-band side cutoff frequency of the middle-band filter is fMHc, and a cutoff frequency of the high-band filter is fHc, in the overlap filter unit 202, the following relationship holds:

$$fMLc \leq fLc$$

$$fHc \leq fMHc.$$

More specifically, $$fMLc \leq fLc < fHc \leq fMHc.$$

When a cutoff frequency of the low-band filter in the cross-over filter unit 200 is fLc', a low-band side cutoff frequency of the middle-band filter is fMLc', a high-band side cutoff frequency of the middle-band filter is fMHc', and a cutoff frequency of the high-band filter is fHc', the following relationship holds:

$$fLc' < fMLc'$$

$$fMHc' < fHc'$$

Figure 3C:
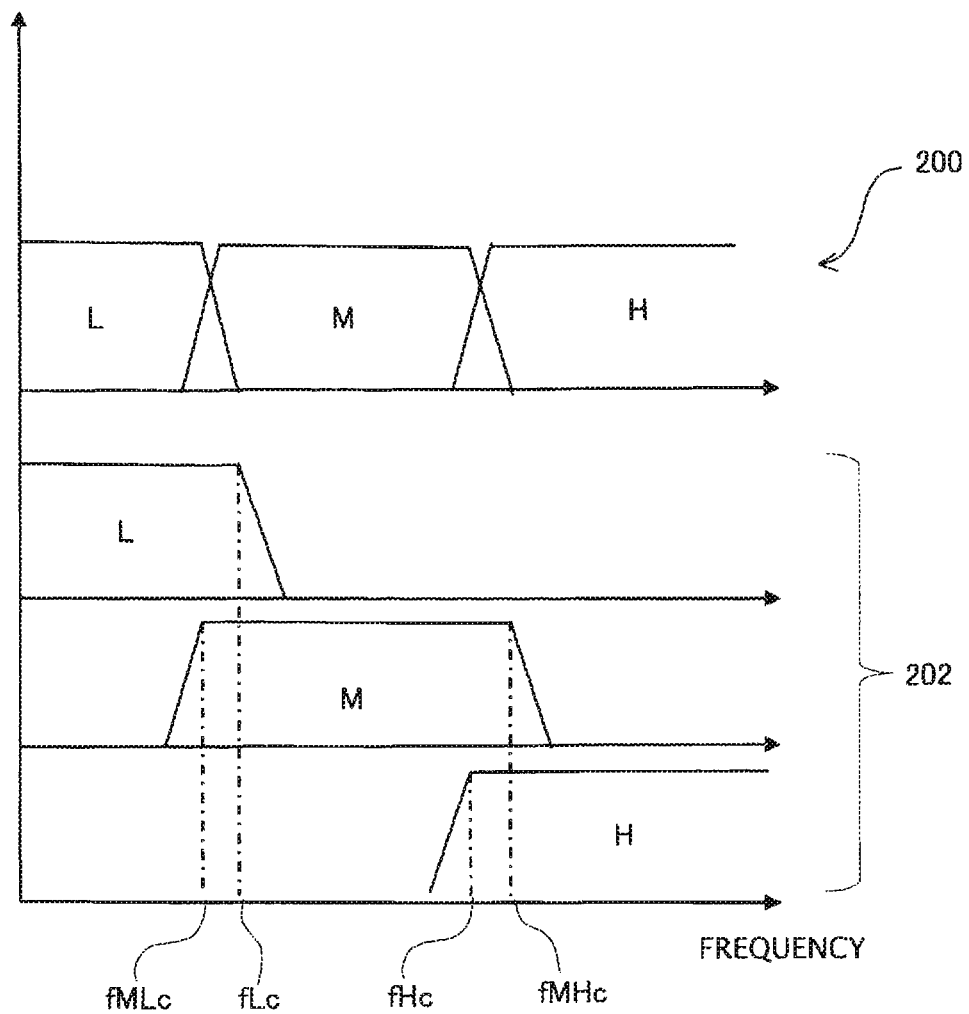
FIG. 3C is an explanatory diagram of a cutoff frequency of an overlap filter unit according to an embodiment of the present disclosure.

FIG. 3C shows in a separated manner frequency characteristics of the low-band filter (L), the middle-band filter (M), and the high-band filter (H) which are filter elements of the overlap filter unit 202. FIG. 3C also shows the size relationship of the cutoff frequencies of the filters. FIG. 3C further shows the filter elements of the cross-over filter unit 200 along with the filter elements of the overlap filter unit 202.

The low-band component is extracted by the low-band filter of the overlap filter unit 202, the middle-band component is extracted by the middle-band filter, the high-band component is extracted by the high-band filter, the control gain is determined in each frequency band, and the limit process is executed. Because the overlap portions 300 and 400 exist and the signal is not attenuated in these portions, an appropriate limiter level is set, and a limiter level is obtained that has no dead zone.

As shown in FIGS. 3A-3C, in the present embodiment, the process flow differs from the process flow of the related art of:

frequency band division (−6 dB cross)→limit process for each band→combining, and the process flow is:

frequency band division (−6 dB cross)→frequency band division (overlap)→control gain setting→limit process for each band→combining.

An embodiment of the present disclosure has been described. The present disclosure, however, is not limited to such a configuration, and various modifications may be made.

For example, in the present embodiment, the multi-band limit process is realized by the CPU 102 reading and executing a process program stored in the program memory, and the CPU 102 functions as the multi-band limiter. Alternatively, the function may be realized by a DSP or as a particular hardware circuit such as a digital filter circuit or the like. As the filter, the use of an FIR (Finite Impulse Response) filter which maintains the linearity of the phase characteristic is desirable, but the filter is not limited to such a filter. However, in the FIR filter, the order must be increased in order to obtain a necessary characteristic, and thus there may be cases in which the FIR filter cannot be realized in a CPU or a DSP having a relatively low processing capability. In this case, an IIR (Infinite Impulse Response) filter may be desirably used in place of the FIR filter. In the IIR filter, because the phase characteristic is not linear compared to the FIR filter, when the combining is executed after the dividing, the frequency characteristic becomes not flat, but as in the present embodiment, it is possible to maintain the flat frequency characteristic by setting only the control gain based on the sound signal which is divided by the overlap filter unit 202, and executing the actual limit process on the signal that has been divided by the cross-over filter unit 200.

A signal passing an LPF (Low-Pass Filter) that uses a second-order IIR filter has a phase delayed by 90 degrees with respect to a signal of a frequency matching a cutoff frequency of the LPF. Similarly, a signal passing an HPF (High-Pass Filter) that uses a second-order IIR filter has a phase advanced by 90 degrees with respect to a signal of a frequency matching a cutoff frequency of the HPF. In this case, the cutoff frequency is reduced by 3 dB. Therefore, when the signal is passed in a series of an overlap filter and a trimming filter, due to the difference in the cutoff frequencies of the filters, the phase relationship would not be maintained. Because the overlap filter is provided in order to calculate the control gain for the limiter, it is sufficient that the overlap filter can detect the level. In the cross-over filter also, in consideration of the phase relationship, crossing at the cutoff frequency is desirable. However, when the signals are crossed at the cutoff frequency, because the cutoff frequency is at a point of −3 dB, the gain would be increased at the time of re-combination. Thus, LPFs and HPFs are connected in two stages in series with the same cutoff frequency. When the signals are passed through two stages at the same cutoff frequency, the signal is reduced by 6 dB at the cutoff frequency, and at the same time, a phase shift of 90 degrees×2=180 degrees occurs. Thus, the signals can be crossed at a cutoff frequency having a clear phase relationship, and at a point of −6 dB. In addition, because of the delay of 180 degrees (two LPFs) and the advancement of 180 degrees (two HPFs), the phase relationship can be returned to the original relationship at the time of re-combination.

In place of storing the process program in a storage medium such as a flash memory in advance, the process program may be downloaded from a server via a network such as the Internet and stored in the memory of the sound recording apparatus. The process program may be provided as an application for sound recording, and in this case, the device that downloads and executes the application for sound recording does not need to be a dedicated sound recording apparatus, and may be an arbitrary portable information terminal such as, for example, a smartphone, which has a CPU, a memory, an input/output interface, and a communication interface.

Moreover, in the present embodiment, the CPLD 134 is required for the embedding process or the like, but when the sound is simply recorded, the CPLD 134 is not necessary.

In addition, in the present embodiment, the cross-over filter unit 200 and the overlap filter unit 202 divide the input sound into three frequency bands including the low band, the middle band, and the high band. The structure, however, is not limited to such a configuration, and alternatively, the input sound may be divided into two frequency bands or four or more frequency bands. When the signal is divided into two bands, in the structure of FIG. 2, the input signal may be divided by the cross-over filter unit 200 into a low-band component and a high-band component, the input sound signal may be divided by the overlap filter unit 202 into a low-band component and a high-band component, control gains for the low band and the high band may be set by the CGs 204 and 208, respectively, a level of the low-band component from the cross-over filter unit 200 may be limited in the multiplier 210 by the control gain from the CG 204, and a level of the high-band component from the cross-over filter unit 200 may be limited in the multiplier 214 by the control gain from the CG 208. In this case, the first filter element and the second filter element respectively correspond to the low-band filter and the high-band filter in the cross-over filter unit 200, and the third filter element and the fourth filter element respectively correspond to the low-band filter and the high-band filter in the overlap filter unit 202. The number of band divisions in the cross-over filter unit 200 and the number of band divisions in the overlap filter unit 202 are identical to each other.

The invention claimed is:

1. A multi-band limiter comprising:
   a divider that includes a first filter element that divides an input sound signal into at least a first component which is of a relatively low band and a second filter element that divides the input sound signal into a second component which is of a relatively high band, and that divides the input sound signal in such a manner that a high-band side cutoff frequency of the first filter element is lower than a low-band side cutoff frequency of the second filter element;
   a limiter that includes a third filter element that divides the input sound signal into at least a third component which is of a relatively low band and a fourth filter element that divides the input sound signal into a fourth component which is of a relatively high band, and that applies a limit process to divide the input sound signal in such a manner that the third component and the fourth component overlap each other by setting a high-band side cutoff frequency of the third filter element to be greater than or equal to a low-band side cutoff frequency of the fourth filter element, to set a first control gain according to the third component and set a second control gain according to the fourth component, and to limit a level of the first component using the first control gain and limit a level of the second component using the second control gain; and
   a combiner that combines and outputs the limit-processed first component and the limit-processed second component.

2. The multi-band limiter according to claim 1, wherein the divider divides the input sound signal into a low-band component, a middle-band component, and a high-band component, the limiter includes a low-band filter element, a middle-band filter element, and a high-band filter element that respectively divide the input sound signal into a low-band component, a middle-band component, and a high-band component, and applies the limit process to divide the input sound signal in such a manner that the low-band component and the middle-band component overlap each other and the middle-band component and the high-band component overlap each other by setting a high-band side cutoff frequency of the low-band filter element to be greater than or equal to a low-band side cutoff frequency of the middle-band filter element and setting a high-band side cutoff frequency of the middle-band filter element to be greater than or equal to a low-band side cutoff frequency of the high-band filter element, and to set a control gain for each of the low-band component, the middle-band component, and the high-band component, and the combiner combines and outputs the limit-processed low-band component, the limit-processed middle-band component, and the limit-processed high-band component.

3. The multi-band limiter according to claim 1, wherein:
the first filter element attenuates the input sound signal according to a first filter characteristic,
the second filter element attenuates the input sound signal according to a second filter characteristic,
when the first filter characteristic and the second filter characteristic are plotted together on a graph indicating amount of attenuation versus frequency, the first filter characteristic crosses the second filter characteristic at a predetermined amount of attenuation, and
the divider sets the predetermined amount of attenuation at −6 dB.

4. The multi-band limiter according to claim 1, wherein the divider, the limiter, and the combiner are a processor.

5. A sound recording apparatus, comprising:
the multi-band limiter according to claim 1; and
a recorder the records an output signal from the multi-band limiter.

6. A non-transitory computer-readable program storage medium that stores a program which, when executed, causes a processor of a computer to function as: a divider that includes a first filter element that divides an input sound signal into at least a first component which is of a relatively low band and a second filter element that divides the input sound signal into a second component which is of a relatively high band, and that divides the input sound signal in such a manner that a high-band side cutoff frequency of the first filter element is lower than a low-band side cutoff frequency of the second filter element; a limiter that includes a third filter element that divides the input sound signal into at least a third component which is of a relatively low band and a fourth filter element that divides the input sound signal into a fourth component which is of a relatively high band, and that applies a limit process to divide the input sound signal in such a manner that the third component and the fourth component overlap each other by setting a high-band side cutoff frequency of the third filter element to be greater than or equal to a low-band side cutoff frequency of the fourth filter element, to set a first control gain according to the third component and set a second control gain according to the fourth component, and to limit a level of the first component using the first control gain and limit a level of the second component using the second control gain; and a combiner that combines and outputs the limit-processed first component and the limit-processed second component.

* * * * *